United States Patent [19]

Schmitt

[11] Patent Number: 4,519,140
[45] Date of Patent: May 28, 1985

[54] SYSTEM FOR IDENTIFYING REFERENCE MARKS IN A PATH MEASURING DEVICE

[75] Inventor: Walter Schmitt, Traunreut, Fed. Rep. of Germany

[73] Assignee: Dr. Johannes Heidenhain GmbH, Traunreut, Fed. Rep. of Germany

[21] Appl. No.: 437,488

[22] Filed: Oct. 28, 1982

[30] Foreign Application Priority Data

Nov. 7, 1981 [DE] Fed. Rep. of Germany ....... 3144334

[51] Int. Cl.$^3$ ............................................. G01B 11/02
[52] U.S. Cl. .............................. 33/125 C; 250/237 G
[58] Field of Search .......... 33/125 A, 125 C, DIG. 3; 250/237 G, 578; 356/375

[56] References Cited

U.S. PATENT DOCUMENTS

| | | | |
|---|---|---|---|
| 3,676,652 | 7/1972 | Millis, Jr. et al. | 235/151.32 |
| 3,838,251 | 9/1974 | Herrin | 235/61.11 E |
| 3,882,301 | 5/1975 | Nassimbene | 235/61.11 E |
| 3,982,106 | 9/1976 | Stutz | 250/237 G |
| 4,044,227 | 8/1977 | Holm et al. | 235/61.7 R |
| 4,086,478 | 4/1978 | Okono | 235/466 |
| 4,101,764 | 7/1978 | Nelle | 250/237 G |
| 4,158,509 | 6/1979 | Rieder et al. | 250/237 G |
| 4,363,964 | 12/1982 | Schmitt | 250/237 G |
| 4,385,836 | 5/1983 | Schmitt | 33/125 C |
| 4,400,890 | 8/1983 | Ohkubo et al. | 33/125 C |
| 4,403,859 | 9/1983 | Ernst | 33/125 C |

FOREIGN PATENT DOCUMENTS

| | | |
|---|---|---|
| A20013799 | 12/1978 | European Pat. Off. . |
| 1814785 | 6/1970 | Fed. Rep. of Germany . |
| 2416212 | 7/1975 | Fed. Rep. of Germany . |
| 2418909 | 11/1975 | Fed. Rep. of Germany . |
| 2540412 | 8/1979 | Fed. Rep. of Germany . |
| 144957 | 11/1980 | Fed. Rep. of Germany .... 33/125 C |

OTHER PUBLICATIONS

Ein Neuartiges Abtastverfahren fur Codemassstabe, by Dr. Ing. Hans Walcher, from Elektronic 1972, Heft, 5, pp. 151-154.

Primary Examiner—Richard R. Stearns
Attorney, Agent, or Firm—Willian Brinks Olds Hofer Gilson & Lione Ltd.

[57] ABSTRACT

An incremental path measuring instrument is disclosed which includes a plurality of reference marks $R_1 \ldots R_n$ which are interposed between respective code marks $C_1 \ldots C_n$. The reference marks and code marks are applied alternately and serially to the reference track included on the measuring scale. A scanning unit is included in the measuring device for scanning in series the reference marks and the code marks. Each of the code marks is unique, and only one of the two adjacent code marks and the respective reference mark must be scanned by the scanning unit in order to identify the reference mark unambiguously. When absolute position values are allocated to respective individual reference marks, the incremental path measuring device can operate in a quasi-absolute mode of operation, since then the position of each of the reference marks is established with respect to a predetermined zero point. Preferably, the code marks each contain beginning of block and end of block symbols in addition to the identifying information needed to identify the respective reference marks. The disclosed path measuring device includes an evaluation circuit which includes a circuit which automatically adapts the trigger threshold required for signal evaluation to the actual amplitudes of the signals.

11 Claims, 4 Drawing Figures

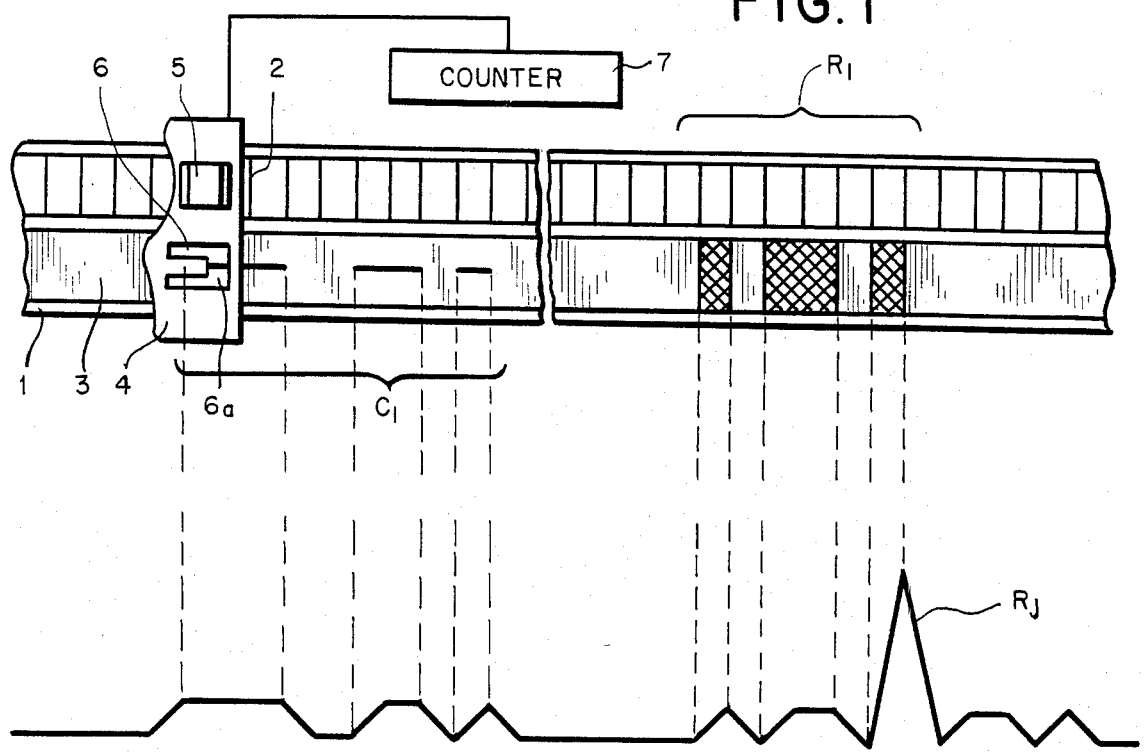
FIG. 1
FIG. 2
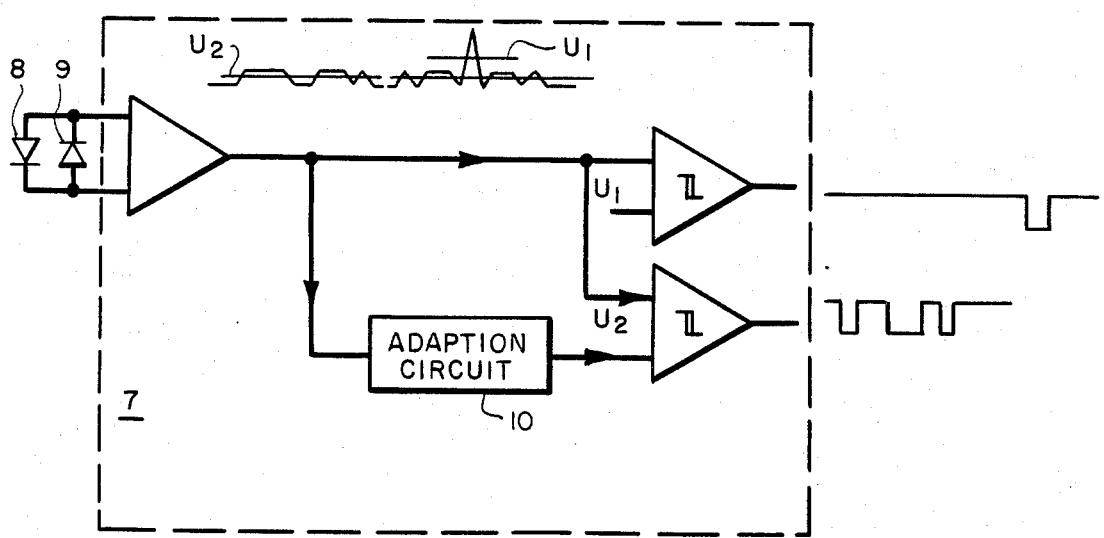
FIG. 3

SYSTEM FOR IDENTIFYING REFERENCE MARKS IN A PATH MEASURING DEVICE

BACKGROUND OF THE INVENTION

This invention relates to a path measuring instrument of the type comprising a scale which defines both a measuring division and a reference track, wherein the reference track defines a plurality of reference marks, and wherein means are provided for scanning the measuring division and the reference track in order to generate output signals which are evaluated in an evaluating means. As used herein, the term "path measuring instrument" is intended to encompass both length and angle measuring instruments.

Path measuring instruments of the general type described above are well known to the art. For example, as disclosed in West German DE-OS No. 24 16 212, it is a known practice to provide a separate reference track alongside an incremental measurement division in an incremental length or angle measuring device, wherein the reference track defines a plurality of reference marks which serve as absolute position markers. In the system disclosed in the above-identified West German patent application, the spacing between individual pairs of reference marks varies from one pair to another. When the incremental division of the scale is scanned, the actual spacing between any two reference marks can be determined from the sum of the increments counted between the two reference marks. This value is a measure of the separation of the two reference marks, and therefore serves to identify the reference marks in question. Thus, in order to determine the identity of any given reference mark and its absolute position, two adjacent reference marks must be scanned. This process can be complicated and time-consuming if, for example, the two adjacent reference marks are separated by any considerable distance. Moreover, in the event the measuring instrument erroneously counts the increments between two reference marks, a false measurement of the separation between the reference marks is determined, and thereby false absolute values may be formed.

SUMMARY OF THE INVENTION

The present invention is directed to an improved system for identifying reference marks in a simple and reliable way in path measuring devices. According to this invention, a path measuring device of the general type described above is provided with means for defining a plurality of distinct code marks, each of which is associated with a respective one of the reference marks. These code marks are positioned such that the code marks are scanned by the scanning means of the path measuring instrument in series with the reference marks. The dependent claims attached hereto define further advantageous features of this invention.

This invention provides the important advantage that specific reference marks can be identified with certainty by evaluating the associated code marks The data contained in the code marks allows the evaluating system of the path measuring device to prepare for the appearance of the next reference mark. Furthermore, only a single reference mark and its associated code mark need be scanned in order to determine the identity of the reference mark in an unambiguous manner.

The invention itself, together with further objects and attendant advantages, will best be understood by reference to the following detailed description taken in conjunction with the accompanying drawings.

BRIEF DESCRIPTION OF THE DRAWINGS

FIG. 1 is a schematic representation of a path measuring instrument which incorporates a presently preferred embodiment of the present invention.

FIG. 2 is a waveform diagram of a scanning signal generated by the embodiment of FIG. 1 in response to the code marks and reference marks shown in FIG. 1.

FIG. 3 is a circuit diagram of a portion of the embodiment of FIG. 1.

DETAILED DESCRIPTION OF THE PRESENTLY PREFERRED EMBODIMENTS

Figure 4:
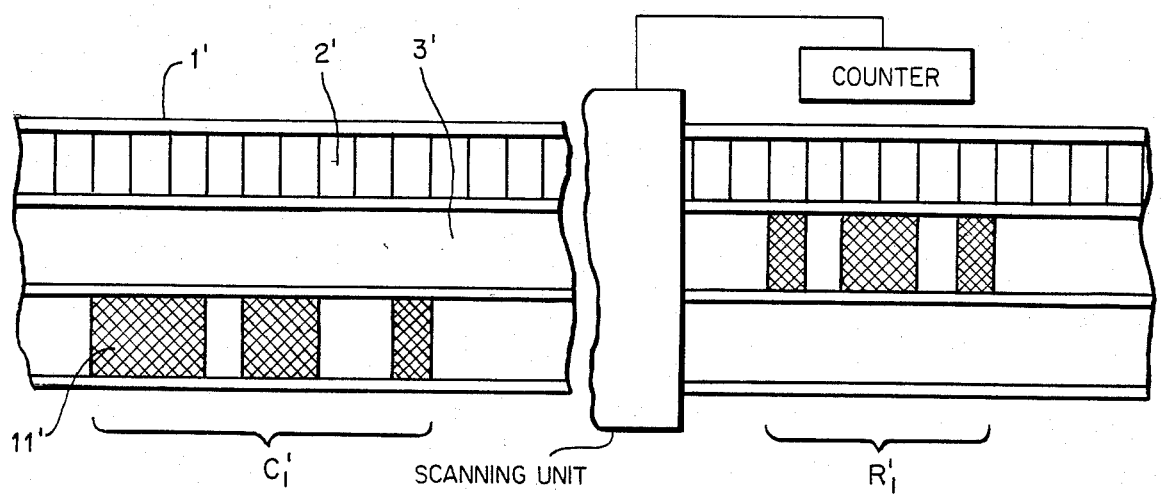
FIG. 4 is a schematic representation of an alternative embodiment of a measuring scale constructed in acordance with this invention.

Turning now to the drawings, FIG. 1 shows a path measuring instrument which includes a preferred embodiment of the present invention. This instrument includes a measuring scale 1 which defines a periodic measuring scale division track 2. The measuring instrument of this embodiment is an incremental length measuring instrument which counts periods of the division track 2 in order to determine the position of a first object coupled to the scanning unit 4 with respect to a second object coupled to the scale 1. The scale 1 also defines a reference mark track 3 which extends alongside and parallel to the division track 2. The scanning unit 4 includes scanning fields 5 and 6 (shown only partly in FIG. 1) which are positioned to photoelectrically scan the incremental division track 2 and the reference mark track 3, respectively. Scanning signals generated by the scanning unit 4 during relative movement between the scale 1 and the scanning unit 4 are applied to an electronic counter 7 which includes an evaluating circuit. In this embodiment, the scanning field 6 defines a constriction 6a, the width of which in the measuring direction is a whole numbered part (1/n where n is an integer) or a whole numbered multiple of the grid constant of the division track 2. This constriction 6a serves to make the sloped portions of the waveform of FIG. 2 more steeply sloped.

The reference mark track 3 of the measuring scale 1 defines a series of reference marks $R_1 \ldots R_n$. FIG. 1 represents only one of these reference marks $R_1$. The detailed structure of the reference marks $R_1$, $R_n$ with respect to the scanning field 5 is described in detail and shown in West German DE-OS No. 18 14 785 (see FIG. 2).

Each time the scanning unit 4 travels over one of the reference marks $R_1 \ldots R_n$, the respective reference mark $R_1 \ldots R_n$ goes into operation and causes the scanning unit 4 to generate a reference pulse $R_J$ which is applied to the counter 7. The counter 7 can be designed to perform various functions in response to these reference pulses $R_J$. Frequently, the reference pulses $R_J$ are evaluated to provide absolute position information. In this way, the incremental measuring device is provided with some of the features of an absolute measuring device. Of course, this is only possible if to each reference mark $R_1 \ldots R_n$ a number is allocated which represents its absolute position with respect to a predetermined zero point. Alternately, a predetermined one of the reference marks $R_x$ can be used to set the counter 7 to zero in response to the reference pulse $R_J$ derived from the predetermined reference mark $R_x$.

All of these functions, however, are possible only if means are provided for recognizing the individual one of the reference marks $R_1 \ldots R_n$ to which any individual reference pulse $R_J$ corresponds.

According to this invention, a plurality of code marks $C_1 \ldots C_n$ are serially arranged on the measuring scale 1 in order to identify respective ones of the individual reference marks $R_1 \ldots R_n$. One of these code marks $C_1$ is shown in FIG. 1, and it should be apparent that the code marks $C_1 \ldots C_n$ are interposed between respective pairs of reference marks $R_1 \ldots R_n$ such that the scanning field 6 of the scanning unit 4 alternately traverses code marks and reference marks as it moves along the scale 1. Each of the code marks $C_1 \ldots C_n$ is distinct from the other code marks $C_1 \ldots C_n$, and includes all of the information needed to identify the associated reference mark. In addition, each of the code marks $C_1 \ldots C_n$ includes a beginning of block symbol at one end and an end of block symbol at the other. These beginning and end of block symbols serve to activate the counter 7. That is, the beginning of block symbol serves to prepare the counter to read out a code mark following the beginning of block symbol. The end of block symbol serves to ensure that the entire code mark has been read off. This positive demarkation of both the beginning and the end of the code mark is important in many applications, since it is possible in the measuring process to stop and reverse the direction of motion of the scanning unit 4 with respect to the measuring scale 1 during the period when one of the code marks $C_1 \ldots C_n$ is being scanned.

Thus, the respective code marks $C_1 \ldots C_n$ are scanned before the scanning unit reaches the associated reference mark $R_1 \ldots R_n$. Since the code marks $C_1 \ldots C_n$ each include identifying information for the associated reference marks $R_1 \ldots R_n$, it is possible to use the known direction of travel of the scanning unit 4 with respect to the scale 1 to determine with certainty the particular reference mark to which any given reference pulse $R_J$ corresponds.

If it is assumed that the scanning unit 4 travels across the measuring scale 1 in a positive direction from left to right as shown in FIG. 1, the scanning unit first scans the code mark $C_1$ and then the reference mark $R_1$. Next, the code mark $C_2$ and the reference mark $R_2$ are scanned in series. This process continues until code mark $C_{n-1}$, reference mark $R_{n-1}$, code mark $C_n$ and reference mark $R_n$ are scanned in the sequence stated. When the scanning unit 4 moves in a negative direction across the scale 1 (i.e. from right to left as shown in FIG. 1), it is apparent that the code mark $C_n$ immediately precedes the reference mark $R_{n-1}$, and so forth.

Regardless of from what direction the scanning unit 4 scans the next reference mark, only two pieces of information are needed to define that reference mark unambiguously: the information derived from scanning one of the two code marks either immediately to the right or immediately to the left of the selected reference mark, and information indicative of the direction of travel of the scanning unit 4. In this way, the counter 7 can always be prepared for any predetermined reference mark $R_x$.

The counter 7 can include circuits or selecting devices for selecting a predetermined reference mark $R_x$ from the plurality of reference marks $R_1 \ldots R_n$, and for bringing the reference pulse $R_J$ associated with this selected reference mark $R_x$ into operation.

Preferably, the code marks $C_1 \ldots C_n$ and the reference marks $R_1 \ldots R_n$ are applied to the scale 1 with a spacing which is either a whole numbered part or a whole numbered multiple of the period of the incremental division 2. In this way, it is ensured that the reference pulses $R_J$ generated in response to the reference mark track 3 are scanned in synchrony with the incremental division track 2. The reference mark track 3 can also be formed as a track in which periodically light and dark fields are applied, similar to the light and dark fields of the incremental division track 2. After a scale 1 incorporating such a reference mark track 3 is fabricated, the individual code marks can be formed by partial etching away of appropriate ones of the dark fields or partial occlusion of appropriate ones of the light fields. In this way, scales with particular code marks can readily be created, and the need is eliminated for keeping large numbers of the scales 1 in stock.

In the production of the measuring scale 1, after the divisions have been applied to the scale 1 individual sections of the measuring scale can be cut out, and then appropriate code marks applied to the respective sections. In this way, the proportion of measuring scales 1 that must be rejected can be greatly diminished. If, for example, in the case of a relatively long measuring scale of the type described in West German DE-OS No. 24 16 212 the reference marks are applied in differing spacings from one another and each is referred to a predetermined zero point, the entire measuring scale is unusable if there is a fault anywhere on the division of the scale. If, however, there is a fault on the division of the above-described measuring scale 1 built in accordance with this invention, the regions of the scale including such division errors can be cut out and removed, and the resulting shorter sections of the measuring scale can each have code marks applied in the manner described above. These shorter sections are fully usable for shorter measurement lengths.

In photoelectric path measuring devices, the amplitude of scanning signals may vary due to aging of the lamp or fouling of optical components of the scanning unit 4. Such changes in the amplitude of the scanning signals may lead to problems in the evaluation of these signals. The circuit shown in FIG. 3 operates automatically to adapt the trigger thresholds for the signals that are obtained by scanning the reference mark track 3 as the scanning unit 4 traverses the reference marks $R_1 \ldots R_n$.

The amplitude of the reference pulse $R_J$ is characteristic of the optical relations obtaining at the point in time the reference pulse $R_J$ is generated. The trigger threshold $U_1$ for the reference pulse $R_J$ is established by balancing the photoelements 8 and 9. By means of structure which is positioned outside of the individual code marks $C_1 \ldots C_n$ of the reference mark track 3, at least one signal, the amplitude of which is stored for evaluation in the adaptation circuit 10, is generated. The adaptation circuit 10 ascertains in this way the trigger threshold $U_2$ for the signals that are obtained from the code marks $C_1 \ldots C_n$. In this way, the trigger threshold $U_2$ is automatically adapted to the particular amplitude of the scanning signal. If the optical relations in the scanning unit change due to changes of lamp brightness or optical fouling, then the trigger threshold $U_2$ is changed in a corresponding manner, so that the dependability of the path measuring instrument remains ensured.

FIG. 4 shows a portion of an alternate embodiment of a scale 1' built in accordance with this invention. This scale 1' is similar to the scale 1 of FIG. 1 in that both scales 1,1' include respective division tracks 2,2'. However, the reference mark track 3' of the scale 1' includes no code marks, and the code marks $C_1' \ldots C_n'$ are applied to a separate auxiliary code track 11' which runs parallel and adjacent to the reference mark track 3'. The scale 1' is used in the same way as the scale 1 described above, except that the scanning unit 4 must be modified to scan the two separate tracks 3',11'. The auxiliary code track 11' can in addition be used to generate a firect flux signal as described in U.S. Pat. No. 4,386,836, which is assigned to the assignee of the present invention.

Of course, it should be understood that a wide variety of changes and modifications to the preferred embodiments described above will be apparent to those skilled in the art. For example, the invention can be used in conjunction with path measuring devices that utilize a scanning principle other than the photoelectric principle. Furthermore, it is possible to adapt this invention for path measuring instruments which use photoelectric techniques for scanning the measuring division 2 and magnetic techniques for scanning the reference track 3. It is, therefore, intended that the foregoing detailed description be regarded as illustrative rather than limiting, and that it be understood that it is the following claims, including all equivalents, which are intended to define the scope of this invention.

I claim:

1. In an incremental path measuring instrument of the type comprising a scale, an incremental measuring division defined by the scale, a reference track defined by the scale which defines a plurality of identical reference marks, means for scanning the division and the reference track in parallel and dynamically generating output signals in response to both the division and the reference track during movement of the scanning means with respect to the scale, and means for evaluating the output signals, said evaluating means comprising a counter for counting output signals generated during and in response to scanning of the division as a measure of the position of the scanning means relative to the scale, the improvement comprising:

means for defining a plurality of code marks, each code mark serially associated with a respective one of the reference marks and distinctive from the other of the code marks such that each of the code marks unambiguously identifies the associated one of the reference marks, said code marks positioned such that the code marks are scanned by the scanning means in series with the reference marks.

2. The invention of claim 1 wherein each of the code marks is positioned on the reference track in the immediate vicinity of the respective reference mark.

3. The invention of claim 1 wherein each of the code marks is positioned on an auxiliary code track adjacent to the reference track in the immediate vicinity of the respective reference mark.

4. The invention of claim 3 wherein at least one of the auxiliary code track and reference track comprises a division having a grid constant which is a whole numbered part or a whole numbered multiple of the grid constant of the measuring division.

5. The invention of claim 4 wherein the scanning means comprises means for defining a scanning field aligned with the auxiliary code track, wherein the scanning field defines a constriction having a dimension in the measuring direction which is a whole numbered part or a whole numbered multiple of the grid constant of the measuring division.

6. The invention of claim 3 wherein the scanning means comprises means for defining a scanning field aligned with the auxiliary code track, wherein the scanning field defines a constriction having a dimension in the measuring direction which is a whole numbered part or a whole numbered multiple of the grid constant of the measuring division.

7. The invention of claim 1 wherein each code mark comprises means for defining a beginning of block symbol and an end of block symbol.

8. The invention of claim 1 wherein the reference track comprises a division having a grid constant which is a whole numbered part or a whole numbered multiple of the grid constant of the measuring division.

9. The invention of claim 1 wherein the evaluating means comprises adaptation circuit means for setting a scanning threshold in response to the amplitude of a signal generated by the scanning means.

10. The invention of claim 1 wherein each of the code marks is defined by the scale.

11. The invention of claim 1 wherein the reference marks alternate with the code marks along a measuring direction defined by the scale such that one of the reference marks and the associated code mark is scanned by the scanning unit before the other.

* * * * *